(12) United States Patent
Liu et al.

(10) Patent No.: US 12,707,761 B2
(45) Date of Patent: Aug. 11, 2026

(54) ILLUMINATOR, ILLUMINATOR FABRICATING METHOD, AND ILLUMINATOR REPAIRING METHOD

(71) Applicant: Century Technology (Shenzhen) Corporation Limited, Shenzhen (CN)

(72) Inventors: Kuang-Hua Liu, Shenzhen (CN); Ming-Yi Hsieh, New Taipei (TW)

(73) Assignee: Century Technology (Shenzhen) Corporation Limited, Shenzhen (CN)

( * ) Notice: Subject to any disclaimer, the term of this patent is extended or adjusted under 35 U.S.C. 154(b) by 506 days.

(21) Appl. No.: 18/137,390

(22) Filed: Apr. 20, 2023

(65) Prior Publication Data

US 2023/0349543 A1 Nov. 2, 2023

(30) Foreign Application Priority Data

Apr. 29, 2022 (CN) ........................ 202210473744.X

(51) Int. Cl.
*H10H 20/01* (2025.01)
*F21Y 115/10* (2016.01)
*H10W 90/00* (2026.01)

(52) U.S. Cl.
CPC ............ *H10H 20/01* (2025.01); *H10W 90/00* (2026.01); *F21Y 2115/10* (2016.08)

(58) Field of Classification Search
CPC . G02F 2202/28; F21Y 2115/10; H10H 20/01; H10H 20/857
See application file for complete search history.

(56) References Cited

U.S. PATENT DOCUMENTS

2007/0216274 A1* 9/2007 Schultz ................ H05K 1/0204 313/46
2018/0190576 A1* 7/2018 Rodriguez ........ H01L 23/49548
2019/0027641 A1* 1/2019 Lee .................... H10H 20/8506
2020/0066693 A1* 2/2020 Kim ...................... H10W 90/00
2020/0111771 A1* 4/2020 Su ......................... H01L 25/167
2022/0367325 A1* 11/2022 Niccum .............. H01L 23/4985

FOREIGN PATENT DOCUMENTS

CN 111128942 A 5/2020

* cited by examiner

*Primary Examiner* — Chad M Dicke
*Assistant Examiner* — Dave Tan
(74) *Attorney, Agent, or Firm* — ScienBiziP, P.C.

(57) ABSTRACT

An illuminator includes a substrate, an interlayer, a plurality of connecting pads, a plurality of LEDs, and a plurality of adhesive blocks. The interlayer is on the substrate. The connecting pads are on a side of the interlayer away from the substrate. Each LEDs is on a corresponding connecting pad. Each adhesive blocks bonds one LED to one connecting pad. The interlayer defines a plurality of grooves, each of the grooves corresponds to a connecting pad, each grooves includes an opening through a surface of the interlayer facing the top side of the illuminator. The opening is configured and arranged so that the corresponding adhesive block, in a molten form, flows through the opening into the corresponding groove of the plurality of grooves. A method of fabricating the illuminator and a method of repairing the illuminator are further disclosed.

20 Claims, 8 Drawing Sheets

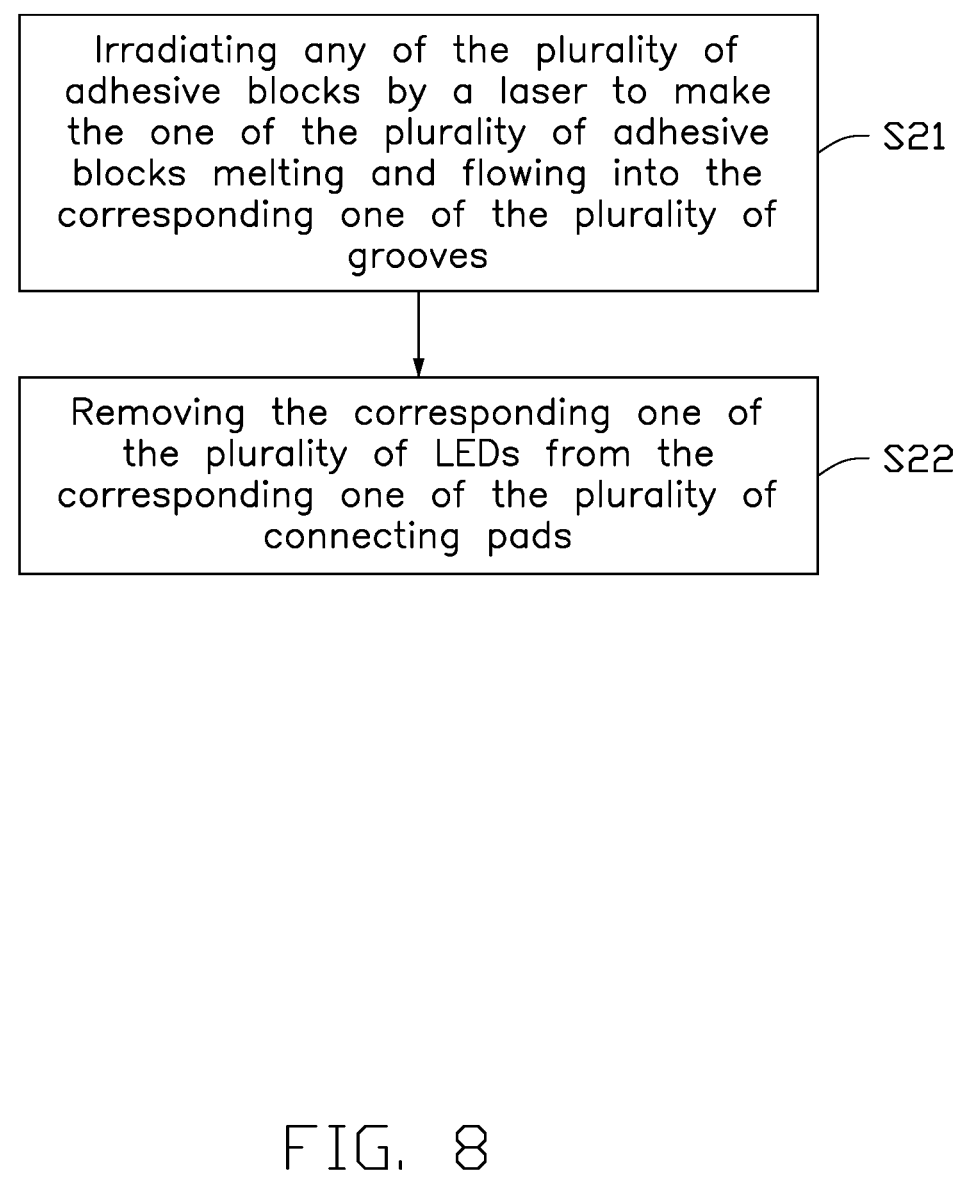

Irradiating any of the plurality of adhesive blocks by a laser to make the one of the plurality of adhesive blocks melting and flowing into the corresponding one of the plurality of grooves — S21

↓

Removing the corresponding one of the plurality of LEDs from the corresponding one of the plurality of connecting pads — S22

FIG. 8

ILLUMINATOR, ILLUMINATOR FABRICATING METHOD, AND ILLUMINATOR REPAIRING METHOD

FIELD

The subject matter herein generally relates to displays, specifically to an illuminator, an illuminator fabricating method, and an illuminator repairing method.

BACKGROUND

Existing illuminator repairing methods usually use a laser to irradiate a damaged light emitting diode (LED) directly, so that the faulty LEDs can be removed after destroying the adhesive material bonding the faulty LEDs. However, the LEDs are between the laser and the adhesive material, the LEDs will adsorb a lot of heat in the process of destroying the adhesive material. Such repairing methods not only cause high energy consumption, but may cause damages to the illuminator.

Moreover, when the laser irradiates an illuminator comprises a protective layer covering the adhesive blocks which are usually sealed by the protective layer, energy of the laser needs to be high enough to vaporize the adhesive to carry out the process of removing the faulty LEDs. During the processes, the adhesive block absorbs heat and expands, which may cause damages to the illuminator.

Therefore, there is room for improvement within the art.

BRIEF DESCRIPTION OF THE DRAWINGS

Implementations of the present disclosure will now be described, by way of embodiment, with reference to the attached figures, wherein:

FIG. 8 is a flowchart of an illuminator repairing method according to an embodiment of the present disclosure.

DETAILED DESCRIPTION

Figure 1:
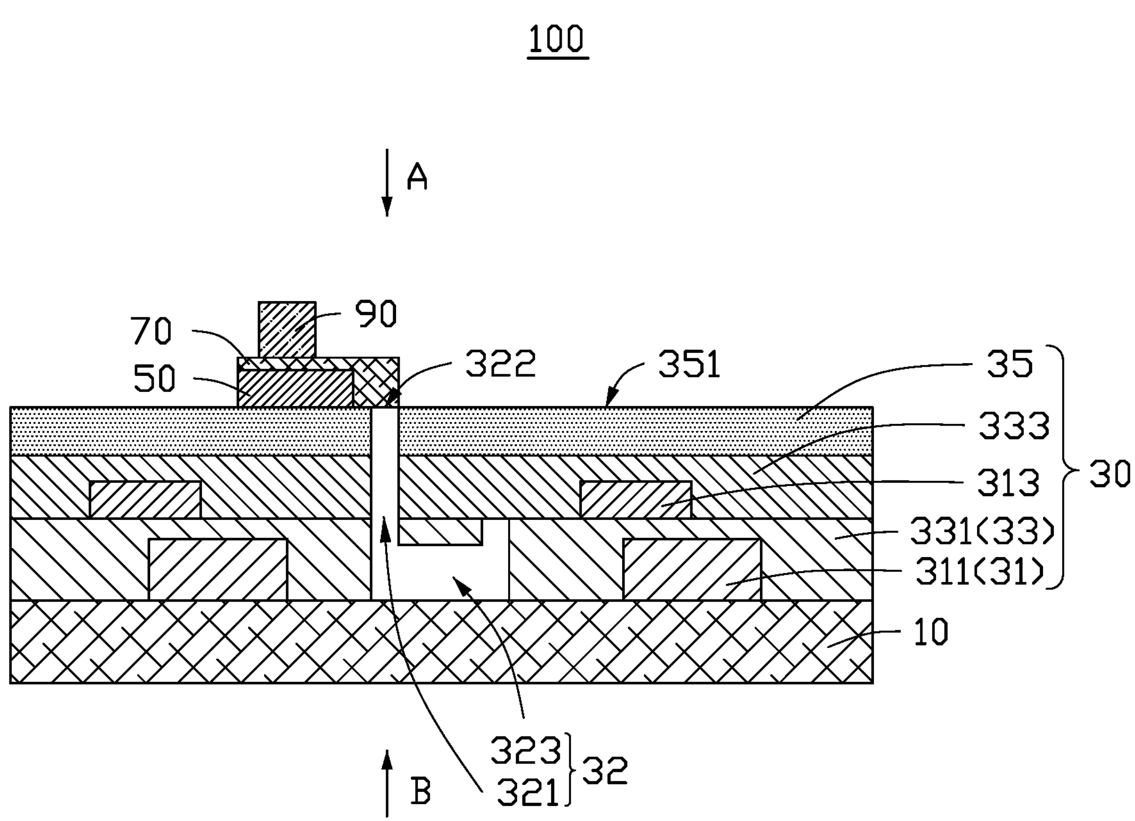
FIG. 1 is a cross-sectional view of an illuminator according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "outside" refers to a region that is beyond the outermost confines of a physical object. The term "inside" indicates that at least a portion of a region is partially contained within a boundary formed by the object. The term "substantially" is defined to be essentially conforming to the particular dimension, shape or other word that substantially modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

"Optional" or "optionally" means that the subsequently described circumstance may or may not occur, so that the description includes instances where the circumstance occurs and instances where it does not.

"Above" means one layer is located on top of another layer. In one example, it means one layer is situated directly on top of another layer. In another example, it means one layer is situated over the second layer with more layers or spacers in between.

When a feature or element is herein referred to as being "on" another feature or element, it can be directly on the other feature or element or intervening features and/or elements may also be present. It will also be understood that, when a feature or element is referred to as being "connected", "attached" or "coupled" to another feature or element, it can be directly connected, attached or coupled to the other feature or element or intervening features or elements may be present.

FIG. 1 illustrates an illuminator 100 according to an embodiment of the present disclosure. The illuminator 100 includes, from a button side to a top side in a following order: a substrate 10, an interlayer 30, a plurality of connecting pads 50, a plurality of adhesive blocks 70, and a plurality of light emitting diodes (LEDs) 90. The interlayer 30 is on the substrate 10. The connecting pads 50 are on a side of the interlayer 30 away from the substrate 10. Each LED 90 is on one connecting pad 50 and bonded to the connecting pad 50 by one adhesive block 70. The interlayer 30 defines a plurality of grooves 32, each groove 32 corresponds to one connecting pad 50. Each groove 32 includes an opening 322 through a surface 351 of the interlayer 30 on a side away from the substrate 10. The opening 322 is formed at a position of the interlayer 30 allowing a corresponding adhesive block 70 to flow through the opening 322 into the corresponding groove 32 upon melting.

In this embodiment, the plurality of connecting pads 50 is arranged as an array and mounted on the substrate 10, the plurality of LEDs 90 on the connecting pads 50 forms a LED array.

In this embodiment, the interlayer 30 includes at least one conductive layer 31 and at least one insulating layer 33. The conductive layer 31 forms conductive traces, the insulating layer 33 is used to electrically isolate the conductive layer 31 and the connecting pads 50. In one embodiment, the interlayer 30 includes a first conductive layer 311, a first insulating layer 331, a second conductive layer 313, and a second insulating layer 333. The first conductive layer 311 is on the substrate 10, the conductive traces formed by the first conductive layer 311 are electrically connected to the plurality of connecting pads 50, respectively. Specific manners for electrically connecting the first conductive layer 311 and the plurality of connecting pads 50 include defining conductive vias with a conductive material therein through the interlayer, and other existing methods in this art.

In this embodiment, the first insulating layer 331 is on a side of the first conductive layer 311 away from the substrate 10, used to prevent short circuit among the conductive traces formed by the first conductive layer 311. The second conductive layer 313 is on a side of the first insulating layer 331 away from the first conductive layer 311. The second conductive layer 313 also forms conductive traces, and the conductive traces formed by the second conductive layer 313 electrically are connected to the plurality of connecting pads 50 respectively. The second insulating layer 333 is on a side of the second conductive layer 313 away from the first insulating layer 331, used to prevent short circuit among the conductive traces formed by the second conductive layer 313. The first conductive layer 311 and the second conductive layer 313 are electrically connected to the plurality of connecting pads 50, respectively, to transfer an electrical signal to each LED 90.

In other embodiments, the interlayer 30 can only include one conductive layer 31 and one insulating layer 33, or include three or more sets of conductive layers 31 and insulating layers 33, which is not restrict in this disclosure. By increasing the number of the conductive layers 31 and the insulating layers 33, the thickness of the interlayer 30 can be increased, so that the depth of the groove 32 can be increased, then the accommodating volume of the groove 32 can be increased to better accommodate the adhesive block 70 upon melting.

In this embodiment, the interlayer 30 further includes a planarization layer 35 on a side of the second insulating layer 333 away from the substrate 10. Specifically, the interlayer 30 also includes a plurality of thin film transistors (TFTs) (not shown in the figures). Each TFT is formed between a set of layers composed of one conductive layer 31 and one adjacent insulating layer 33, and corresponds to a connecting pad 50. The TFTs are used to control the intensity of the electrical signal transmitted by the conductive layer 31 to the connecting pad 50, thereby controlling the on and off of the LED 90 or the brightness of the LED 90. The planarization layer 35 is used to cover TFTs formed on the second conductive layer 313 and TFTs formed on the second insulating layer 333, not only for protection, but also for flattening a side of the interlayer 30 away from the substrate 10, so as to arranging the connecting pads 50. A material of the planarization layer 35 can be photoresist, polyimide, silicon oxide, etc.

In this embodiment, the LED 90 can be a vertical LED, including a first electrode near the substrate 10 and a second electrode away from the substrate 10 (not shown in the figure). The first electrode electrical is electrically connected to the connecting pad 50 through the adhesive block 70 for receiving the electrical signal transmitted from the conductive layer 31 to the connecting pad 50. When a voltage difference is formed between the first electrode and the second electrode of the LED 90, the LED 90 will emit light in response to the voltage difference.

In another embodiment, the LED 90 can also be a front-mounted LED or a flip chip LED. Specifically, when the LED 90 is a front-mounted LED, both electrodes (a first electrode and a second electrode) of the LED 90 is on a side away from the substrate 10. In this case, the interlayer 30 does not include the conductive layer 31, and the illuminator 100 further includes a trace layer on the plurality of LEDs 90 away from the substrate 10. The trace layer is used to power the LEDs 90. When the LED 90 is a flip chip LED, both electrodes (a first electrode and a second electrode) of the LED 90 are on a side near the substrate 10. In this case, each electrode of the LED 170 is electrically connected to a connecting pad 50 to power the LED 90.

In this embodiment, each LED 90 can be a mini LED or a micro LED. The size of the micro LED is about 1 μm-100 μm, the size of the mini LED is about 100 μm-200 μm. The illuminator 100 can be used as a backlight module of a liquid crystal display device to provide a light source, a self-luminous display device, or the illuminator such as stage lights or mosquito killing lamps. The present disclosure does not limit the application of the illuminator 100.

In this embodiment, the groove 32 includes a connecting hole 321 and a chamber 323. The chamber 323 pass through a surface of the first conductive layer 331 near to the substrate 10. The connecting hole 321 passes through the interlayer 30 from a side of the interlayer 30 away from the substrate 10 and is communicated with the chamber 323. The connecting hole 321 forms the opening 322 on a side of the interlayer 30 away from the substrate 10. Specifically, the chamber 323 is a cavity pass through a surface of the first conductive layer 311 away from the connecting pads 50, used to accommodate the adhesive block 70 upon melting, so that the adhesive blocks 70 are exposed to the substrate, allowing a laser B illustrating the adhesive blocks 70 from a side of the substrate 10 away from the connecting pads 50. The connecting hole 321 is used to connect the chamber 323 and a surface 351 of the interlayer 30 on a side away from the substrate 10, thereby guiding the fused adhesive block 70 flow into the groove 32 from the opening 322. In other embodiments, the groove 32 can only include the connecting hole 321 without the chamber 323. The groove 32 does not pass through the surface of the first conductive layer 311 on a side away from the connecting pads 50, a laser A is used to illustrate the adhesive blocks 70 from a side of the adhesive blocks 70 away from the substrate 10.

In this embodiment, the connecting pads 50 does not cover the opening 322 at all. Specifically, the orthographic projection of a profile of the opening 322 on the substrate 10 can be tangent to the orthographic projection of the connecting pad 50 on the substrate 10, or the orthographic projection of the profile of the opening 322 is spaced apart from the orthographic projection of the connecting pad 50 on the substrate 10. As a result, when the adhesive block 70 melts, the adhesive block 70 in the fluid state can flow into the groove 32 from the opening 322. In other embodiments, the connecting pad 50 can also partially cover the opening 322, so that the adhesive block 70 can completely flow into the groove 32 after melting, avoiding remains of material of the adhesive block 70 on the surface 351.

In this embodiment, the adhesive block 70 at least partially covers the opening 322. Specifically, the adhesive block 70 extends from the connecting pad 50 toward the opening 322, and partially covers the opening 322.

In this embodiment, a material of the adhesive block 70 can be silver glue, tin paste, epoxy resin, indium tin oxide or allotropic conductive adhesive. When the adhesive block 70 is irradiated by a laser, the heat absorbed by the adhesive block 70 is increased with the laser energy from low to high. When the adhesive block 70 reaches a certain temperature, the adhesive block 70 begins to melt, and when the temperature rises further, the adhesive block 70 will begin to vaporize.

Figure 2:
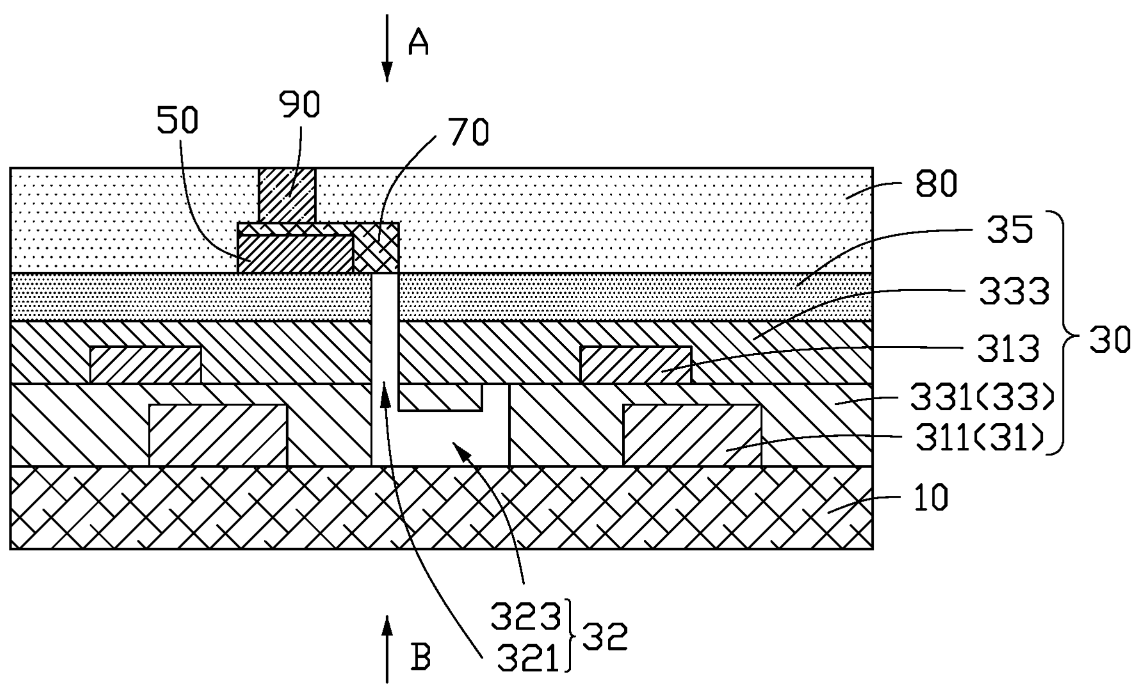
FIG. 2 is a cross-sectional view of an illuminator according to another embodiment of the present disclosure.

In another embodiment, as FIG. 2 shows, the illuminator 100 also includes a protective layer 80. The protective layer 80 is on a side of the interlayer 30 away from the substrate 10, and at least covers portions of the plurality of adhesive blocks 70 not covered by the LEDs 90. Specifically, the LEDs 90 may not fully cover the adhesive blocks 70, thus the adhesive blocks 70 partially exposed relative to the LEDs 90, and the protective layer 80 is used to cover the exposed adhesive blocks 70 to play a protective role. The protective layer 80 also covers surfaces of the connecting pads 50 not covered by the adhesive blocks 70 and may even side surfaces of the LEDs 90.

In this embodiment, the material of the substrate 10 is light-transmitting, and the substrate 10 is exposed relative to the adhesive block 70. Specifically, a laser B can irradiate the adhesive block 70 from a side of the substrate 10 away from the adhesive block 70 via the groove 32. In another embodiment, the material of the protective layer 80 is light-transmitting, a laser A can irradiate the adhesive block 70 from a side of the protective layer 80 away from the substrate 10.

By defining one groove 32 on the interlayer 30 corresponding to each connecting pad 50, and arranging the opening 322 of the groove 32 at a position that can allow the fused adhesive block 70 flowing into the groove 32 through the opening 322, the LED 90 can released from the connecting pad 50. Avoiding the laser irradiating the adhesive block 70 through the LED 90, which is conductive to saving energy. The fused adhesive block 70 flows into the groove 32 through the opening 322, not only save energy, but also prevents remaining of the material of the fused adhesive block 70 on the surface of the interlayer 30, or prevents the adhesive block 70 from thermal expansion resulting in damage to the illuminator 100 when the adhesive block 70 is sealed by the protective layer 80.

Figure 3:
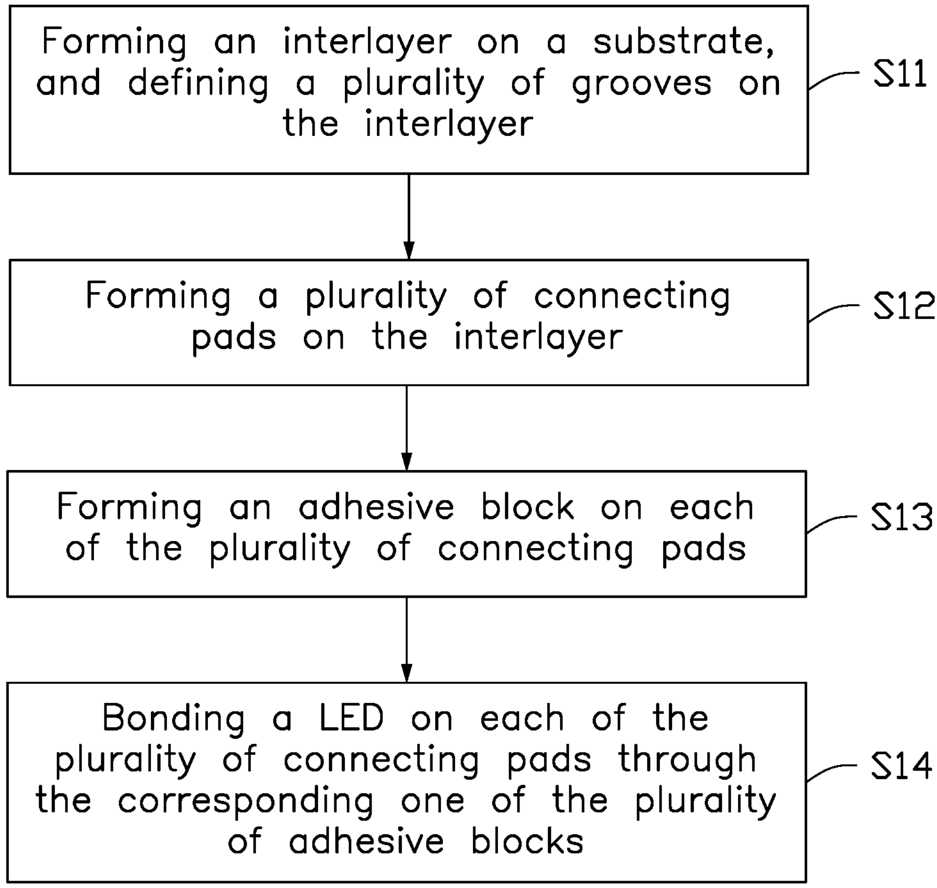
FIG. 3 is a flowchart of an illuminator fabricating method according to an embodiment of the present disclosure.
Figure 4:
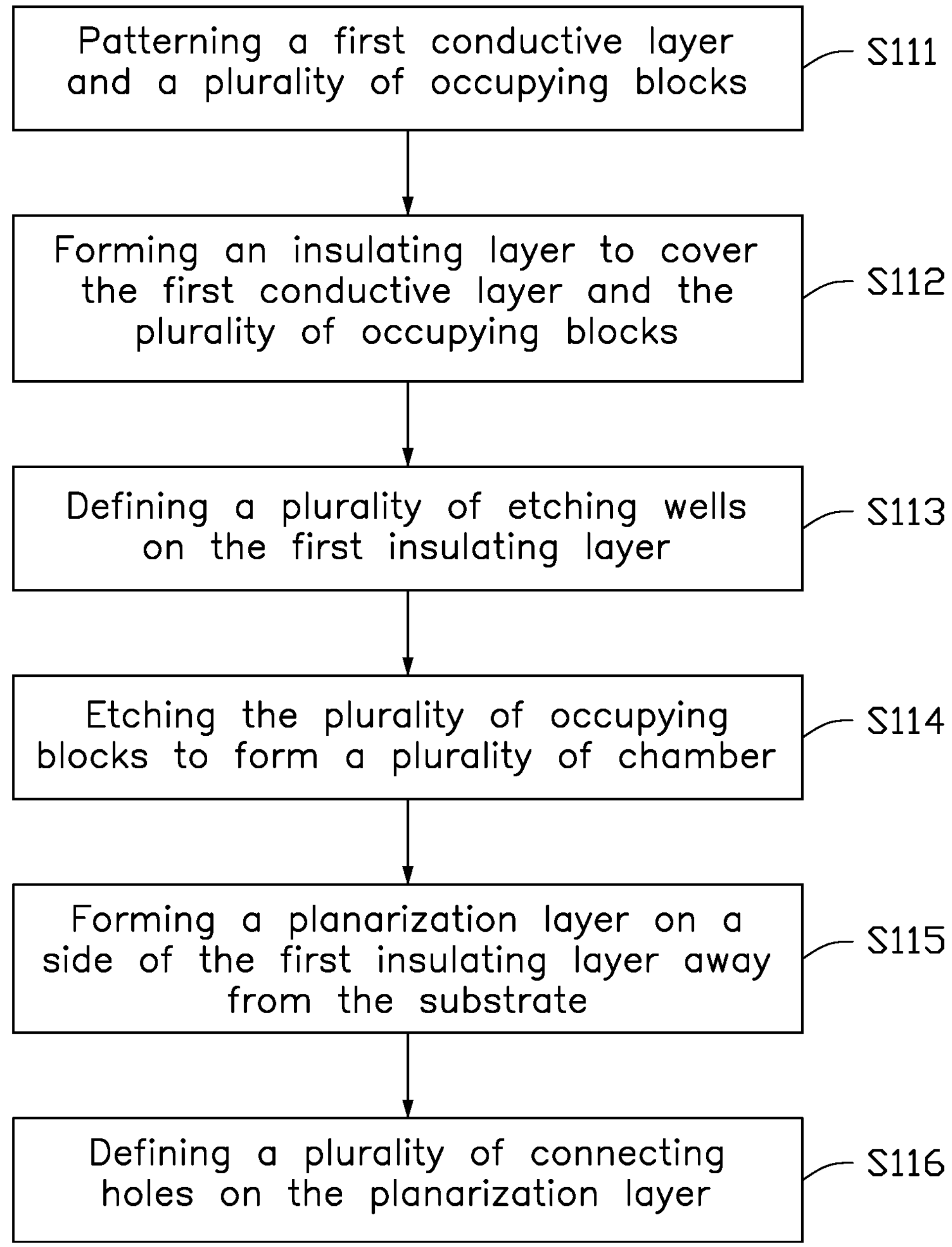
FIG. 4 is a flowchart of Block S1 in the method of FIG. 3.

Referring to FIG. 3, a flowchart is presented in accordance with an illuminator fabricating method embodiment which is being thus illustrated. The illuminator fabricating method is provided by way of example, as there are a variety of ways to carry out the method. The method described below can be carried out using the configurations illustrated in FIGS. 4 to 7, for example, and various elements of these figures are referenced in explaining example method. Each block shown in FIG. 3 represents one or more processes, methods or subroutines, carried out in the exemplary method. Additionally, the illustrated order of blocks is by example only and the order of the blocks can change according to the present disclosure. The exemplary method can begin at block S11.

At block S11, an interlayer is formed on a substrate, a plurality of grooves is defined in the interlayer, and each groove includes an opening through a surface of the interlayer away from the substrate.

At block S12, a plurality of connecting pads are formed on the interlayer.

At block S13, an adhesive block is formed on each of the connecting pads, and the adhesive block at least partially covers the opening.

At block S14: a LED is bonded on each of the plurality of connecting pads through the corresponding one of the plurality of adhesive blocks.

In this embodiment, the interlayer 30 formed on the substrate 10 in block S11 includes at least one conductive layer 31 and at least one insulating layer 33. The conductive layer 31 forms conductive traces, the insulating layer 33 is used to electrically isolate the conductive layer 31 and the connecting pads 50. Specifically, referring to FIG. 4, a flow chart is presented in accordance with the Block S11, which can begin at S111.

At S111, a first conductive layer and a plurality of occupying blocks are patterned.

At S112, an insulating layer is formed to cover the first conductive layer and the plurality of occupying blocks.

At Block S113, a plurality of etching wells is defined on the first insulating layer, each of the plurality of occupying blocks is exposed through one of the plurality of etching wells.

At Block S114, the plurality of occupying blocks is etched to from a plurality of chambers.

At Block S115, a planarization layer is formed on a side of the first insulating layer away from the substrate.

At Block S116, a plurality of connecting holes is defined on the planarization layer, each of the connecting holes communicates to one of the plurality of chambers to form the grooves.

Figure 5:
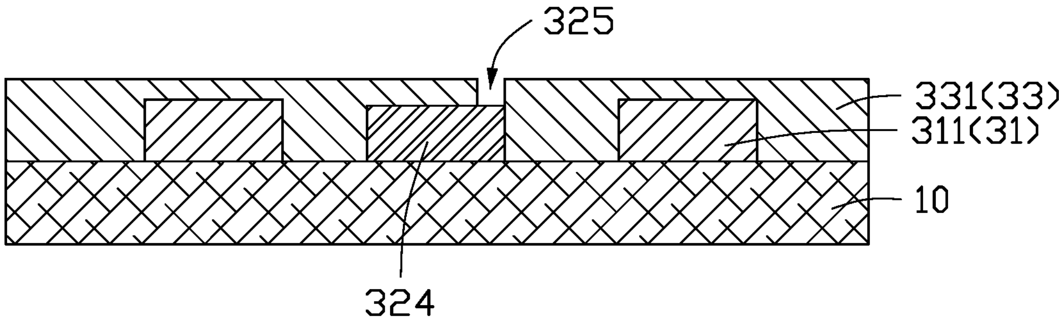
FIG. 5 is a cross-sectional view showing an embodiment of the illuminator at Block S13 of FIG. 4.

In this embodiment, as FIG. 5 shows, at the block S111, the patterned conductive layer 311 is formed on the substrate 10 by etching, exposure development, etc., that is, conductive traces are formed. The occupying block 324 can use a same material as the first conductive layer 311, or use other materials.

In this embodiment, the etching wells 325 defined in block S113 is used to expose the occupying block 324 relative to the first insulating layer 331, thus facilitating etching.

In this embodiment, the Block S114 further includes:

Block S1141: covering a metal layer and a patterned photoresist layer on the interlayer successively;

Block S1142: etching the metal layer and the photoresist layer to form a patterned second conductive layer;

Block S1143: forming a second insulating layer to cover the second conductive layer.

Figure 6:
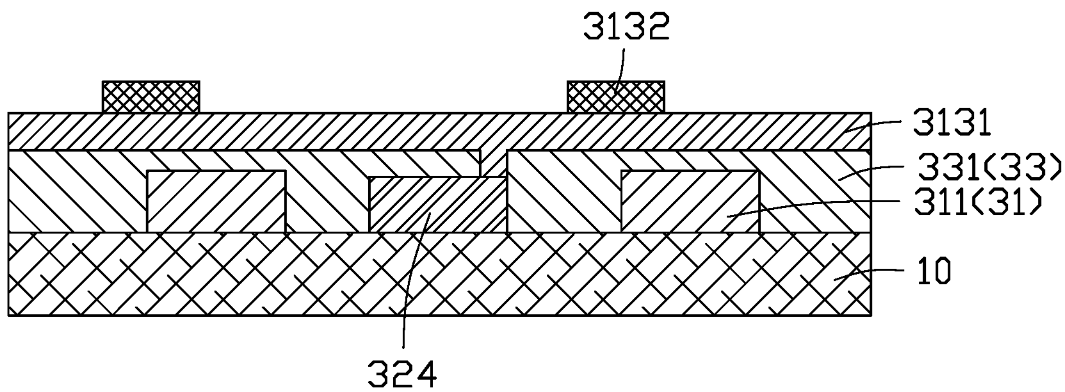
FIG. 6 is a cross-sectional view showing an embodiment of the illuminator at Block S14 of FIG. 4.

FIG. 6 illustrates a cross-sectional view of the illuminator 100 being fabricated in the process of Block S114, the metal layer 3131 covers the first insulating layer 331 and the etching wells 325 simultaneously. The patterned photoresist layer 3132 plans the position of the conductive traces of the second conductive layer 313. By etching the metal layer 3131 and the photoresist layer 3132, the occupying block 324 is etched at the same time as the patterned second conductive layer 313 is formed, thus forming the chamber 323. The second insulating layer 333 covers the second conductive layer 313 and the plurality of etching wells 325 simultaneously.

Figure 7:
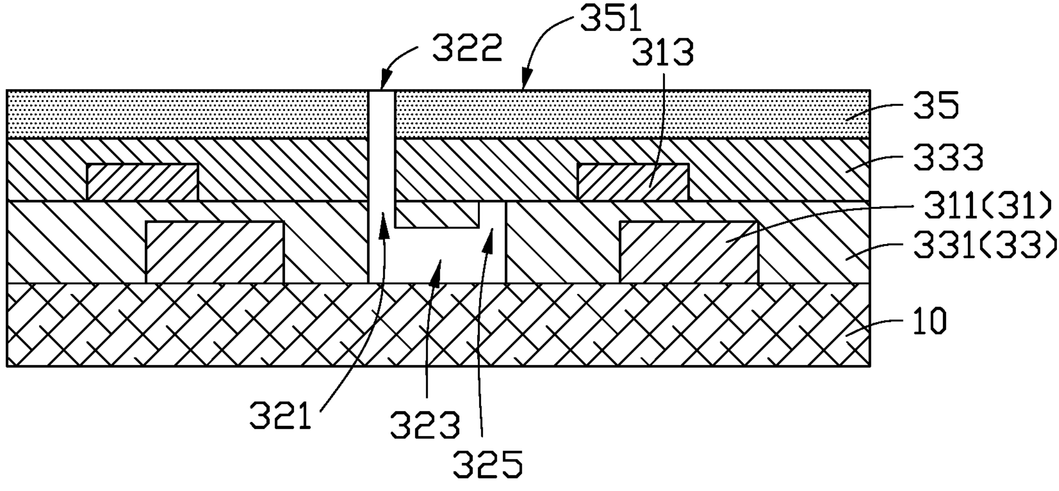
FIG. 7 is a cross-sectional view showing an embodiment of the illuminator at Block S16 of FIG. 4.

In this embodiment, as FIG. 7 shows, at block S116, the connecting hole 321 is defined through a surface 351 of the planarization layer 35 away from the substrate 10 and is aligned with each of the chamber 323, thus connects the surface 351 on a side of the planarization layer 35 away from the substrate 10 to the chamber 323.

In this embodiment, at block S12: the connecting pad 50 is formed corresponding to each of the opening 322 on the surface 351. The connecting pad 50 may not cover the opening 322, so as to allow the fused adhesive block 70 to flow into the groove 32 quickly. The connecting pad 50 may also partially covers the opening 322, so as to avoid the fused adhesive block 70 left on the surface 351.

In this embodiment, at block S13, the adhesive 70 is formed on each connecting pad 50, and extend to a direction of the opening 322 to partially cover the opening 322, so as to leave a space for a laser irradiation.

In this embodiment, after bonding a LED on each of the plurality of connecting pads through the corresponding one of the plurality of adhesive blocks, further comprising: forming a protective layer 80, the protective layer 80 at least covers portion of each adhesive block 70 not covered by the LEDs 90. Thus, the adhesive block 70 is protected to avoid the adhesive block 70 losing viscosity after long term contact with the external environment, resulting in the lose of the LED 90.

By forming the first conductive layer 311 and the occupying block 324 used to form the chamber 324 simultaneously, and etching the occupy block 324 and the metal layer 3131 at the same time, the process of fabricating the grooves 32 can combined with the existing process of fabricating an illuminator to optimize the process. By defining the chamber 323, it is beneficial to provide a space for the melted adhesive block 70 when repairing the LED 90, so as to release the bonding between the LED 90 and the connecting pad 50.

Referring to FIG. 8, a flowchart is presented in accordance with an illuminator repairing method embodiment which is being thus illustrated. The illuminator repairing method is provided by way of example, as there are a variety of ways to carry out the method. The method described below can be carried out using the configurations illustrated in FIGS. 1 to 2, for example, and various elements of these figures are referenced in explaining example method. Each block shown in FIG. 8 represents one or more processes, methods or subroutines, carried out in the exemplary method. Additionally, the illustrated order of blocks is by example only and the order of the blocks can change according to the present disclosure. The exemplary method can begin at block S21.

The illuminator repairing method in this embodiment is used to repair the illuminator 100. Since the size of the LEDs 90 in the illuminator 100 has a small size (about 1 μm-200 μm), the LEDs 90 will be transferred to the substrate 10 by mass transfer method. In this process, there may be some cases of failure of LED 90. For example, some LEDs 90 themselves have quality problems, or the LED 90 has dislocation during the transferring process, resulting in poor contact. Therefore, after fabricating the illuminator 100, it is necessary to check whether the LED 90 will emit light normally, and repair the LEDs 90 cannot emit light. The repairing of illuminator 100 includes removing or destroying the wrong LEDs 90, and bonding new LED 90 to the connecting pad 50.

As FIG. 1 and FIG. 2 shows, at block S21, a laser irradiates any of the adhesive blocks to make the adhesive block melting and flowing into the corresponding one of the plurality of grooves;

At block S22, the corresponding one of the LEDs 90 is removed from the corresponding connecting pad.

In this embodiment, a laser A can irradiate the adhesive block 70 from a side of the adhesive block 70 away from the substrate 10, until the adhesive block melts and flows into the groove 32, then remove the LED 90. In another embodiment, the substrate 10 is a light transparent substrate, a laser B can pass through the connecting hole 321 to irradiate the adhesive block 70 from a side of the substrate 10 away from the groove 32, so that the adhesive block 70 can melt and flow into the groove 32, and the LED 90 can be removed.

In this embodiment, after removing the LED 90, further includes: bonding a new LED 90 on the connecting pad 50.

In this embodiment, irradiating the adhesive block 70 and removing the LED 90 can be carried out simultaneously. Specifically, the LED 90 can be catch while the laser A or laser B is shining the adhesive block 70, and the LED 90 can be removed when the adhesive block 70 begins to melt, thus speeding the repairing process.

By guiding the melted adhesive block 70 into the groove 32, a damage of the illuminator 100 caused by high energy laser can be avoided, thus saving the energy. By setting the substrate 10 as a transparent substrate, a laser B can irradiate the adhesive block 70 from a side of the substrate 10 away from the interlayer 30, thus the LED 90 can be removed from a side of the interlayer 30 away from the substrate 10 when the adhesive block 70 begins to melt, which is conductive to improving efficiency.

It is to be understood, even though information and advantages of the present exemplary embodiments have been set forth in the foregoing description, together with details of the structures and functions of the present exemplary embodiments, the disclosure is illustrative only. Changes may be made in detail, especially in matters of shape, size, and arrangement of parts within the principles of the present exemplary embodiments to the full extent indicated by the plain meaning of the terms in which the appended claims are expressed.

What is claimed is:

1. An illuminator comprising, from a bottom side to a top side in a following order: a substrate; an interlayer; a plurality of connecting pads; a plurality of adhesive blocks; and a plurality of light emitting diodes (LEDs), wherein:

each of the plurality of LEDs is on a corresponding connecting pad of the plurality of connecting pads, each of the plurality of adhesive blocks bonds a corresponding LED of the plurality of LEDs to the corresponding connecting pad, and is partially covered by the corresponding LED, the interlayer defines a plurality of grooves each positioned to the corresponding connecting pad, each of the plurality of grooves comprises an opening through a surface of the interlayer facing the top side of the illuminator, and a position of the opening is configured and arranged so that the corresponding adhesive block, in a molten form, flows through the opening into the corresponding groove of the plurality of grooves, and each of the plurality of grooves is configured to receive substantially an entire amount of the corresponding adhesive block in the molten form to release the corresponding LED from the corresponding connecting pad.

2. The illuminator of claim 1, wherein the corresponding adhesive block at least partially covers the opening.

3. The illuminator of claim 1, wherein the interlayer comprises at least one conductive layer and at least one insulating layer, each of the at least one insulating layer corresponds to one of the at least one conductive layer; the at least one conductive layer forms conductive traces electrically connected to the plurality of connecting pads.

4. The illuminator of claim 3, wherein the interlayer comprises a conductive layer and an insulating layer; the conductive layer is on the substrate, and the insulating layer is on a side of the conductive layer facing the top side of the illuminator.

5. The illuminator of claim 3, wherein the interlayer comprises at least two conductive layers and at least two insulating layers; and the at least two conductive layers and the at least two insulating layers are alternately arranged.

6. The illuminator of claim 5, wherein each of the plurality of grooves comprises a connecting hole and a chamber; the chamber extends through a surface of the conductive layer on the substrate facing away from the connecting pads; the connecting hole extends through the interlayer and communicates with the chamber; the connecting hole defines the opening.

7. The illuminator of claim 1, further comprising a protective layer on a side of the interlayer facing the top side of the illuminator; the protective layer covers at least a portion of each of the plurality of adhesive blocks which is not covered by the plurality of LEDs.

8. The illuminator of claim 1, wherein the illuminator is a backlight of a liquid crystal display, a display panel of a self-luminous display, or a lighting device.

9. The illuminator of claim 1, wherein the plurality of grooves extends through the interlayer to expose the substrate to the plurality of adhesive blocks.

10. The illuminator of claim 9, wherein the substrate is made of a transparent material.

11. The illuminator of claim 6, wherein a volume of the chamber is equal to or greater than a volume of the corresponding adhesive block; the corresponding adhesive block in the molten form is accommodated in the chamber.

12. The illuminator of claim 1, wherein an orthographic projection of a profile of the opening on the substrate is tangent to or spaced apart from an orthographic projection of the corresponding connecting pad on the substrate.

13. The illuminator of claim 1, wherein the interlayer further comprises a planarization layer, and the planarization layer is an outermost layer of the interlayer facing the top side of the illuminator.

14. An illuminator comprising, from a bottom side to a top side in a following order:

a substrate;

an interlayer on the substrate and comprising at least one conductive layer and at least one insulating layer;

a plurality of connecting pads on a side of the interlayer away from the substrate;

a plurality of adhesive blocks; and a plurality of light emitting diodes (LEDs);

wherein each of the plurality of LEDs is bonded to a corresponding connecting pad of the plurality of connecting pads by a corresponding adhesive block of the plurality of adhesive blocks;

the interlayer defines a plurality of grooves each positioned to the corresponding connecting pad and comprising a connecting hole and a chamber; the connecting hole extends through the interlayer to form an opening through a surface of the interlayer facing the top side of the illuminator and communicates with the chamber; the chamber extends into the at least one conductive layer toward the substrate; and the connecting hole and the chamber are collectively configured such that, the corresponding adhesive block, in a molten form, flows through the connecting hole into the chamber to release the corresponding LED from the corresponding connecting pad.

15. The illuminator of claim 14, wherein the corresponding adhesive block at least partially covers the opening.

16. The illuminator of claim 14, wherein the interlayer comprises at least two conductive layers and at least two insulating layers; and the at least two conductive layers and the at least two insulating layers are alternately arranged.

17. The illuminator of claim 14, further comprising a protective layer on a side of the interlayer facing the top side of the illuminator; the protective layer covers at least a portion of each of the plurality of adhesive blocks which is not covered by the plurality of LEDs, surfaces of the plurality of connecting pads which is not covered by the plurality of adhesive blocks and side surfaces of the plurality of LEDs.

18. The illuminator of claim 14, wherein the substrate is made of a transparent material.

19. The illuminator of claim 14, wherein an orthographic projection of a profile of the opening on the substrate is tangent to or spaced apart from an orthographic projection of the corresponding connecting pad on the substrate.

20. The illuminator of claim 14, wherein the interlayer further comprises a planarization layer, and the planarization layer is an outermost layer of the interlayer facing the top side of the illuminator.

* * * * *